(12) United States Patent
Osoinach et al.

(10) Patent No.: US 8,115,499 B2
(45) Date of Patent: Feb. 14, 2012

(54) DEVICE WITH PROXIMITY DETECTION CAPABILITY

(75) Inventors: Bryce T. Osoinach, Phoenix, AZ (US); Tak Kwan Vincent Ko, Tsuen Wan (HK)

(73) Assignee: Freescale Semiconductor, Inc., Austin, TX (US)

( * ) Notice: Subject to any disclaimer, the term of this patent is extended or adjusted under 35 U.S.C. 154(b) by 344 days.

(21) Appl. No.: 12/470,729

(22) Filed: May 22, 2009

(65) Prior Publication Data

US 2010/0295559 A1 Nov. 25, 2010

(51) Int. Cl.
*G01R 27/26* (2006.01)
*G06F 3/041* (2006.01)
*G06F 3/045* (2006.01)

(52) U.S. Cl. ......... 324/686; 324/662; 345/174; 345/173

(58) Field of Classification Search .......... 324/713, 324/691, 649, 600, 522, 663, 662, 661, 658, 324/671, 686, 635, 644, 699, 716, 688; 340/686.6, 340/686.1, 539.23, 545.1, 2, 4, 541, 6; 345/173, 345/174
See application file for complete search history.

(56) References Cited

U.S. PATENT DOCUMENTS

| | | | |
|---|---|---|---|
| 4,345,167 A | 8/1982 | Calvin | |
| 6,937,951 B2 | 8/2005 | Gibb et al. | |
| 7,076,381 B2 | 7/2006 | Gibb et al. | |
| 7,119,554 B2 | 10/2006 | Nakamura et al. | |
| 7,138,809 B2 | 11/2006 | Nakamura et al. | |
| 7,583,092 B2 * | 9/2009 | Reynolds et al. | 324/688 |
| 7,705,611 B2 * | 4/2010 | Ogata et al. | 324/661 |
| 7,821,274 B2 * | 10/2010 | Philipp et al. | 324/662 |
| 7,876,105 B2 * | 1/2011 | Ogata et al. | 324/662 |
| 2003/0021078 A1 | 1/2003 | Van Berkel | |
| 2008/0018608 A1 * | 1/2008 | Serban et al. | 345/173 |
| 2008/0018611 A1 * | 1/2008 | Serban et al. | 345/173 |
| 2010/0107770 A1 * | 5/2010 | Serban et al. | 73/718 |

FOREIGN PATENT DOCUMENTS

| | | |
|---|---|---|
| JP | 04-124736 A | 4/1992 |
| JP | 2007-242571 A | 9/2007 |
| JP | 2008004465 A | 1/2008 |
| WO | 2009037379 A1 | 3/2009 |

OTHER PUBLICATIONS

PCT/US2010/033360 International Search Report and Written Opinion mailed May 3, 2010.

* cited by examiner

*Primary Examiner* — Hoai-An D Nguyen
(74) *Attorney, Agent, or Firm* — Ingrassia Fisher & Lorenz, PC (57) ABSTRACT

The electrical equivalent of a relatively large area proximity detection capability is provided in a space limited electronic device (20, 30) with many individual input electrodes (24, 34, 44) by dynamically coupling parallel groups of the individual electrodes (24, 34, 44) and applying a proximity and/or contact test thereto. The parallel grouped electrodes act like a single large electrode and permit proximity detection at greater distances and with greater sensitivity. A multiplexer (74) automatically couples individual input electrodes (23, 24, 44) and then parallel grouped electrodes to the proximity (or contact) sensor(s) (46, 66), so that they are scanned and sensed individually and collectively in a time less than human reaction time, whereby the proximity sense function appears as if provided by a separate large area electrode. Proximity spatial detection accuracy is increased by using some of the electrodes (24, 34, 44) as driven shields to remove positional ambiguity.

21 Claims, 7 Drawing Sheets

| S1 | S2 | CONNECTS (i, j) ELECTRODE TO |
|---|---|---|
| 0 | 0 | GND |
| 0 | 1 | SDV |
| 1 | 0 | PD & S |
| 1 | 1 | ID & S |

FIG. 9 109

| ELECTRODE (i, j) → | S1 S2 VALUES | | | | | | |
|---|---|---|---|---|---|---|---|
| SEQUENCE STAGE | 1, 1 | 2, 1 | 3, 1 | 4, 1 | 5, 1 | ... | X, Y |
| 1 | 11 | 00 | 00 | 00 | 00 | ... | 00 |
| 2 | 00 | 11 | 00 | 00 | 00 | ... | 00 |
| 3 | 00 | 00 | 11 | 00 | 00 | ... | 00 |
| 4 | 00 | 00 | 00 | 11 | 00 | ... | 00 |
| ⋮ | ⋮ | ⋮ | ⋮ | ⋮ | ⋮ | ⋮ | ⋮ |
| N | 00 | 00 | 00 | 00 | 00 | ... | 11 |
| N+1 | 10 | 10 | 10 | 10 | 10 | ... | 10 |

| ELECTRODE (i, j) → | S1 S2 VALUES | | | | | | |
|---|---|---|---|---|---|---|---|
| SEQUENCE STAGE | 1, 1 | 2, 1 | 3, 1 | 4, 1 | 5, 1 | ... | X, Y |
| 1 | 11 | 01 | 01 | 01 | 01 | ... | 01 |
| 2 | 01 | 11 | 01 | 01 | 01 | ... | 01 |
| 3 | 01 | 01 | 11 | 01 | 01 | ... | 01 |
| 4 | 01 | 01 | 01 | 11 | 01 | ... | 01 |
| ⋮ | ⋮ | ⋮ | ⋮ | ⋮ | ⋮ | ⋮ | ⋮ |
| N | 01 | 01 | 01 | 01 | 01 | ... | 11 |
| N+1 | 10 | 10 | 10 | 10 | 10 | ... | 10 |

DEVICE WITH PROXIMITY DETECTION CAPABILITY

FIELD OF THE INVENTION

The present invention generally relates to electronic devices and their methods of operation, and more particularly, arrangements and methods for providing a large area proximity detection capability for electronic devices with multiple input touch-pads, buttons keys, or touch screens.

BACKGROUND OF THE INVENTION

There are many modern electronic devices that employ touch pads, buttons, keys, and/or touch screens for user input. Non-limiting examples are cell phones, music and video players, electronic games, personal digital assistants (PDSs), portable computers and microcomputers, various controllers and other consumer and commercial, medical and industrial electronic devices. The term "electrode" singular or plural is used herein to refer to these various input elements (e.g., touch-pads, buttons, keys, touch screens, any kind of switches, etc.) whether physical (e.g., an actual structural element) or virtual (e.g., an image on a screen or other display) responsive to a user input. Arrays of such electrodes in either physical or virtual form are often referred to as keyboards or keypads. It is often the case that such devices have arrays of multiple input electrodes leaving little or no space for a larger electrode or sensor capable of providing general proximity detection. Such general proximity detection is useful, for example, to determine that a user's finger or input stylus is approaching the unit or the electrode array, even before it can be sensed by an individual electrode or, for example, in the case of a cell phone or the like, when the unit is being moved toward the side of one's head or brought close to an ear. This capability has not been available in the prior art for devices whose crowded electrode arrays allow little or no space for a separate large area general proximity detection element and is much desired. Thus, there is an ongoing need for means and methods by which a general proximity detection capability can be incorporated in an electronic device even when its crowded nature prevents a large area proximity detection element from being included or so limits its area that its effectiveness is undesirably reduced.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction and operation of the invented system and method, and descriptions and details of well-known features and techniques may be omitted to avoid unnecessarily obscuring the invention. Additionally, elements in the drawings figures are not necessarily drawn to scale. For example, the dimensions of some of the elements or regions or layers in the figures may be exaggerated relative to other elements or regions or layers to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation or fabrication in sequences or arrangements other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner.

Figure 1:
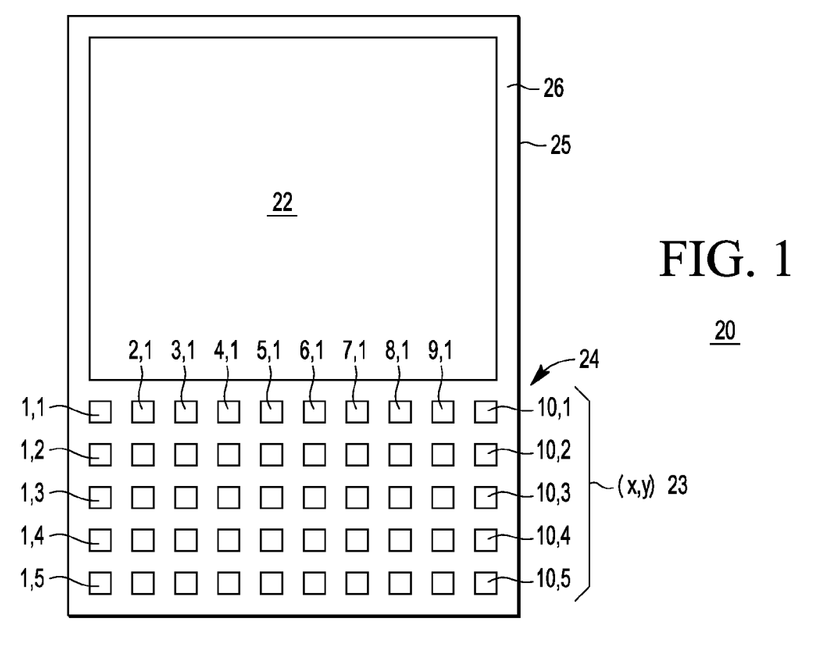
FIGS. 1 and 2 are simplified schematic plan views of generalized electronic devices having a large number of input electrodes.
Figure 2:
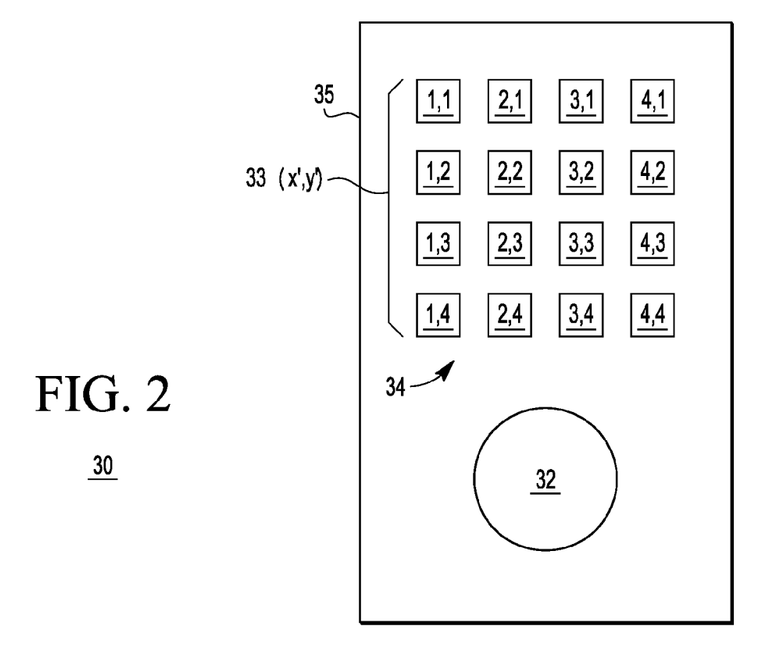

FIGS. 1 and 2 illustrate plan views of exemplary devices 20, 30 having a large number of input electrodes 24, 34 on input face 26, 36. FIG. 1 is a plan view of generalized electronic device 20 having viewing screen 22 and x,y array 23 of input electrodes 24 on face 26 of case 25. By way of example and not intended to be limiting, device 20 of FIG. 1 has fifty input electrodes 24 in x,y array 23, but larger or smaller numbers may be provided in other embodiments. FIG. 2 is a plan view of generalized electronic device 30 having control wheel 32 and x',y' array 33 of input electrodes 34 on face 36 of case 35. By way of example and not intended to be limiting, device 30 of FIG. 2 has sixteen input electrodes 34 in x',y' array 33, but larger or smaller numbers may be provided in other embodiments. Array 23 (e.g., x,y) and array 33 (e.g., x',y') are referred to collectively as array or arrays X,Y, wherein it is understood that X is the column number in the array and Y is the row number in the array. Thus, in device 20, X,Y has maximal value 10,5 for a total of N=X*Y=10*5=50 input electrodes and in device 30, X,Y has maximal value 4,4 for a total of N=X*Y=4*4=16 input elements (plus the control wheel), but these are intended to be merely exemplary and not intended to be limiting and X, Y, and N can have any integer values. For the purposes of the present description, the designation i,j is intended to refer to any electrode of the array from 1,1 to X,Y, that is, the input electrodes in the arrays 23, 33 can take on values from 1,1 . . . i,j . . . X,Y where X and Y can have any values depending on the number of electrodes in the input array. The particular input arrays illustrated herein are presented by way of example and not limitation.

Devices 20 and 30 differ in that device 20 includes display 22 of some type and device 30 has no display but includes control wheel 32 of some type. Either arrangement or a combination thereof is useful, and the presence or absence of a display and/or control wheel is not important to the illustrated embodiments. Usually such devices have self-contained energy supplies (e.g., batteries, fuel cells, etc.) but this is not essential and embodiments described herein apply to both portable and plug-in types of devices and to any type of device intended to receive user input via contact with and/or proximity to input electrodes (real or virtual) by a finger or stylus or analogous instrument controlled by the user or by the input electrodes of the unit as a whole being brought into proximity with a part of the body (e.g., head, ear, etc.) or other large conductive object. As used herein, the terms "input element" and "activation element" are intended to be interpreted broadly and include any object by which the user interacts with the input electrodes, as for example but not limited to one or more fingers, a stylus or various other instruments adapted for approaching or touching the input electrode to register an input or for approaching or touching groups of electrodes, as for example in the situation where the unit is being brought into proximity with a head or ear, etc. The parenthetical phrase "e.g., a finger, stylus, or ear" is included in the text that follows at various places as a reminder of the comprehensive definition provided above and not as a further limitation, where the word "stylus" is intended to refer to any hand-held object that may be used to activate input electrodes.

For convenience of explanation and not intended to be limiting, it is assumed in the discussion that follows that electric field sensing is used to determine whether a particular electrode is being approached or contacted by the input element but persons of skill in the art will understand based on the description herein that other types of proximity and/or contact sensing may also be employed and the proximity or touch sensing inputs may be free standing electrodes, such as are shown in FIGS. 1-2, or may be incorporated in a display screen in the form of virtual electrodes or may be a combination thereof. Either arrangement is useful. Non-limiting examples of useful alternative sensing techniques are optical sensing, magnetic field sensing and combinations of optical, electric and/or magnetic field sensing, which may be used instead of the electric field sensing illustrated herein. For convenience of description, as used hereafter, the words "input electrode" and equivalents, singular or plural, are intended to include any form of input activation device that is proximity and/or contact sensitive, including but not limited to those mentioned above in either physical or virtual form or both. Further, the designation "electrode" is not intended to imply that actual physical contact between the activation element and the input electrode is required, although it is not precluded. "Proximity sensitive" means that the electrode or other sensing means is adapted to detect the approach of the input element (e.g., a finger, stylus or ear) even before contact is or may be made.

In many cases the input electrodes may be very small, especially where the device itself is intended to be hand-held and a large number of input electrodes need to be included. Common examples are devices incorporating a "qwerty" keyboard, a 10 to 12-key number and/or symbol pad, and other multifunction input electrode arrays. Each electrode is usually small and the array of electrodes can take up substantially the entire available space on the input face of the device, especially if the device also incorporates a large display. Device 20 of FIG. 1 illustrates this situation where the combination of display 22 and input electrode array 23 consumes nearly all of the space available on input face 26 of device 20. A problem with this situation is that there is no room left on input face 26 for a large area electrode or sensing element to be used for general proximity detection. The various embodiments described here overcome this limitation by dynamically combining individual input electrodes into a large area common electrode for general proximity sensing purposes, and then automatically returning the electrodes of the combination to individual sensing status. Detection selectivity is enhanced in further embodiments by coupling selected electrodes together to form a driven shield element surrounding or adjacent to a particular electrode that is being sensed. It will be further noted that even though device 30 of FIG. 2 may have sufficient unused space on input surface 36 to accommodate a larger area general proximity detection element, this can add undesirable additional cost. Thus, the various embodiments described herein for achieving the electrical equivalent of a large area proximity detection element are useful even where the device has sufficient space to accommodate a dedicated large area proximity detection element.

Figure 3:
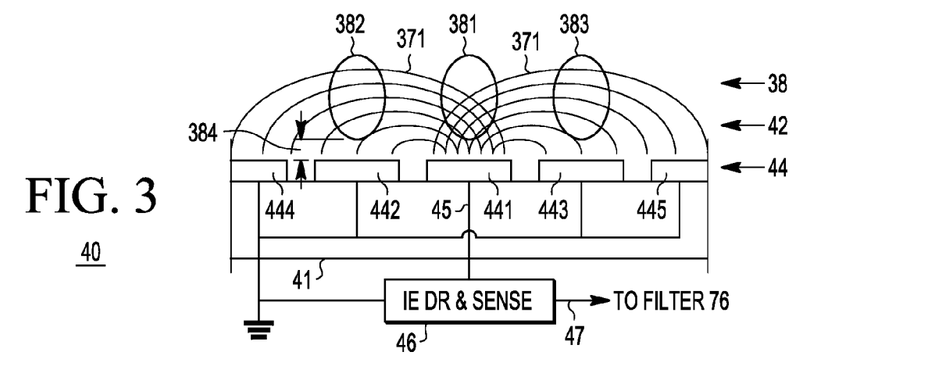
FIGS. 3-6 are simplified schematic side or cross-sectional views of portions of the electrode arrays of FIGS. 1 and 2 under various circumstances, illustrating how an approaching input element (e.g., a finger, stylus or ear) can perturb the electric field and therefore the apparent capacitance associated with a particular input electrode, according to the present invention.

FIGS. 3-6 are simplified schematic side or cross-sectional views of arrangements 40, 50, 60, 60' of portions of electrode arrays 23, 33 of devices 20, 30 of FIGS. 1-2 illustrating how approaching input element 38 (e.g., a finger, stylus or ear) can perturb electric field 42, 52, 62, 62' associated with a particular input electrode i,j or combination of input electrodes, according to embodiments of the present invention. Referring now to FIG. 3 illustrating arrangement 40 with substrate 41 having thereon centrally located electrodes 441, 442, 443 and peripheral electrodes 444, 445 laterally outboard thereof on substrate 41. Centrally located electrodes 441-443 and peripheral electrodes 444-445 are collectively referred to as electrodes 44 and are assumed in this example to be capacitive elements so that variations in the electric field associated therewith may be detected by sensing changes in the apparent capacitance of the input electrodes. In the configuration of FIG. 3 it is assumed that middle electrode 441 is being driven and sensed, that is, it is coupled by lead 45 to individual electrode driver and sense (IE DR & SENSE) element 46. Adjacent electrodes 442-445 are coupled to the reference potential of IE DR & SENSE element 46. For convenience of explanation the reference potential is assumed throughout to be ground (GND) potential, but in other embodiments, other reference potentials may be employed and the term "ground" and abbreviation GND as used herein are intended to include such other reference potentials. The interior details of substrate 41, electrodes 44 and IE DR & SENSE element 46 are omitted in FIGS. 3-6 to avoid unduly cluttering the drawings.

Input element 38 (e.g., a finger, stylus or ear) is illustrated in three positions located above electrodes 44 of FIG. 2 by similar distances 384; wherein middle position 381 is above sensed electrode 441 and positions 382-383 are above grounded electrodes 442-443 on either side of sensed electrode 441. Lines 371 schematically illustrate electric field 42 in FIG. 3 between middle (sensed) electrode 441 and neighboring grounded electrodes 442-445 when biased by IE DR & SENSE element 46. In a preferred embodiment IE DR & SENSE element 46 comprises, by way of example and not intended to be limiting, a conventional pulsed (e.g., square wave) constant current source (not shown) for driving electrode 441 and a conventional voltage measuring device (not shown) for sensing the voltage appearing on electrode 441 in response to the constant current pulse supplied by IE DR & SENSE element 46. Such elements are conventional. Electrode 441 is assumed to be substantially a capacitive element, that is, to have negligible ohmic leakage. The voltage on electrode 441 begins to rise as the capacitance associated with electrode 441 is charged by the current drive pulse supplied by IE DR & SENSE element 46, thereby creating electric field 42. The voltage rise associated with charging the capacitance of electrode 441 is detected (i.e., "sensed") by IE DR & SENSE element 46. The proximity of input element 38 (e.g., a finger, stylus or ear) perturbs localized electric field 42 and changes the effective capacitance of electrode 441. This apparent change in capacitance causes the voltage response detected by IE DR & SENSE element 46 to be different depending upon the presence or absence and proximity of input element 38. It is often the case that the closer input element 38 is to sensed electrode 441, the larger the apparent capacitance and the smaller the voltage rise for a given amount of charge supplied by the current drive pulse from IE DR & SENSE element 46. The voltage response detected by IE DR & SENSE element 46 is reported via sensed voltage output 47 to, for example, filter 76 of detection system 70 of FIG. 7, whose operation is explained later. Thus, the combination of IE DR & SENSE element 46 and electrode 441 can serve as a proximity detector even before physical contact occurs between input element 38 and electrode 441. While the proximity response detected by arrangement 40 is largest when input element 38 is in position 381 directly over middle (sensed) electrode 441, the fringing of electric field 42 between middle electrode 441 and adjacent (e.g., grounded) electrodes 442-445 limits the precision in detecting the topographical location of input element 38 (e.g., a finger, stylus or ear). For example, depending on the apparent change in voltage detected by IE DR & SENSE element 46, it may be difficult to resolve unequivocally whether input element 38 is in position 381, 382, 383 or in between.

Figure 4:
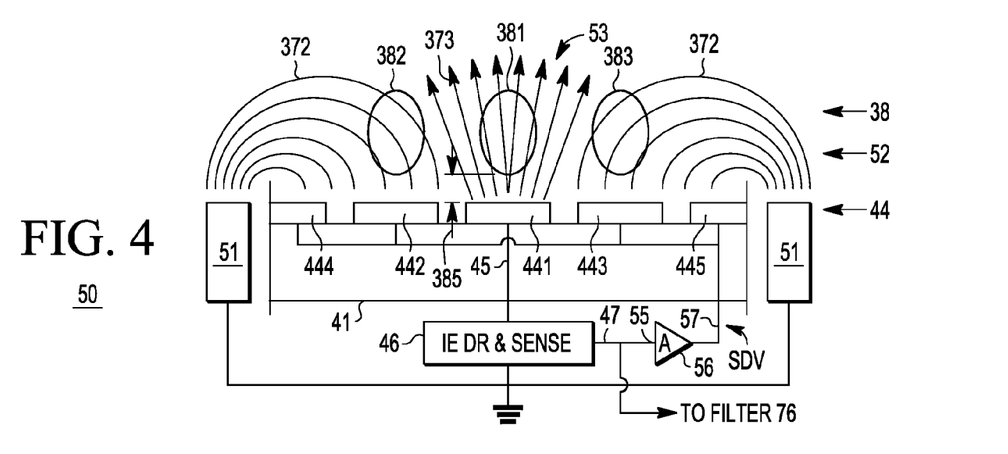

Referring now to FIG. 4 illustrating arrangement 50 with substrate 41 having thereon centrally located electrodes 441, 442, 443 and peripheral electrodes 444, 445 laterally outboard thereof on substrate 41. Centrally located electrodes 441-443 and peripheral electrodes 444-445 are collectively referred to as electrodes 44 and are assumed in this example, as with arrangement 40, to be capacitive elements. In the configuration of FIG. 4 it is assumed, as before, that middle electrode 441 is being driven and sensed, that is, it is coupled by lead 45 to individual electrode driver and sense (IE DR & SENSE) element 46, the same as in FIG. 3. But adjacent electrodes 442-445 are not coupled to GND as they were in FIG. 3. Sensed voltage output 47 of IE DR & SENSE element 46 is coupled for example, to filter 76 of detection system 70 of FIG. 7 and to input 55 of amplifier 56. Output 57 of amplifier 56 is coupled to peripheral electrodes 442-445 and, in some embodiments, also to input 743 of multiplexer 74 of detection system 70 of FIG. 7. Amplifier 56 is desirably an operational amplifier, so that adjacent electrodes 442-445 have the same potential as sensed electrode 441. The output of amplifier 56 on lead 57 coupled to electrodes 442-445 is referred to as the "shield drive voltage," abbreviated as SDV. This creates electric field 52 indicated schematically by lines 372 between peripheral electrodes 442-445 and more remote ground 51. Electrodes 442-445 adjacent to sensed electrode 441 function as a driven shield having the same electrical potential (i.e., the SDV) as sensed electrode 441. Thus, no electric field exists between sensed electrode 441 and adjacent electrodes 442-445, rather electric field 53 indicated by lines 373 exists between sensed electrode 441 and remote grounds 51. Remote ground 51 can be located anywhere. It will be apparent that input element 38 only perturbs electric field 53 when in position 381 above central electrode 441 and has substantially little or no effect when in positions 382, 383. Thus, arrangement 50 is capable of much greater positional accuracy in proximity detection of input element (e.g., a finger, stylus or ear) 38. While it may provide higher positional accuracy, it is not especially useful for general proximity detection since input element 38 must be close to individual sensed electrode 441 before a significant change in capacitance of electrode 441 can be detected by IE DR & SENSE element 46.

Figure 5:
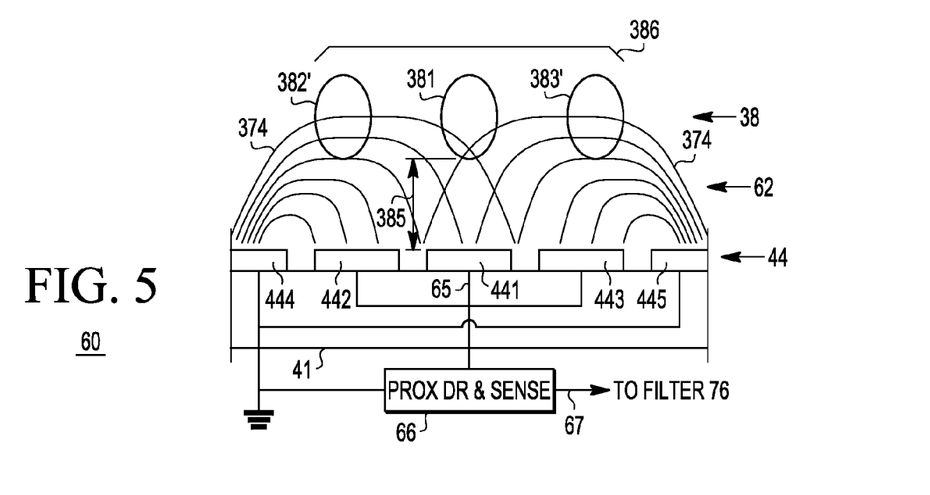
Figure 6:
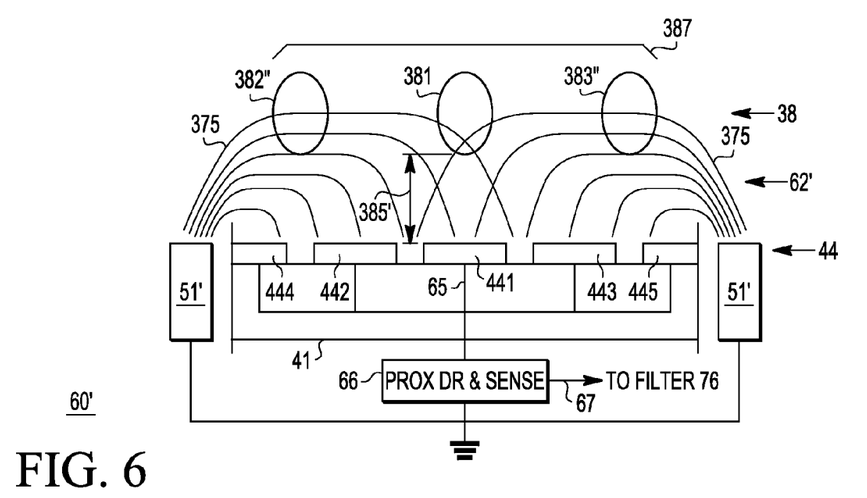

Referring now to FIG. 5 illustrating arrangement 60 with substrate 41 having thereon centrally located electrodes 441, 442, 443 and peripheral electrodes 444, 445 generally laterally outboard thereof on substrate 41. Centrally located electrodes 441-443 and peripheral electrodes 444-445 are collectively referred to as electrodes 44 and are assumed in this example to be capacitive elements, as in connection with FIGS. 3-4. In the configuration of FIG. 5 it is assumed that central electrode 441 is being driven and sensed, that is, it is coupled by lead 65 to proximity driver and sense (PROX DR & SENSE) element 66. Adjacent electrodes 442-443 are also coupled in parallel with electrode 441 to drive-sense lead 65. Electrodes 444-445 are coupled to the reference potential of PROX DR & SENSE element 66, e.g., GND. PROX DR & SENSE element 66 is similar in construction and operation to IE DR & SENSE element 46 but adapted to operate at higher current since it is driving the combination of several electrodes 441-443, and in some embodiments, may be driving most or all of available electrodes 44. In this configuration, electric field 62 schematically indicated by lines 374 extends from parallel coupled electrodes 441-443 to GND electrodes 444-445. Thus, input element 38 (e.g., a finger, stylus or ear) can be in any of positions 381, 382', 383' as indicated by bracket 386 and at greater distance 385 from combined electrodes 441-443 and still have substantial impact on the apparent capacitance of combined electrodes 441-443. Thus, arrangement 60 is better suited to general proximity detection since it can detect the presence of input element 38 over a wider extent 386 and at greater distances 385 from electrodes 441-443. PROX DR & SENSE element 66 reports changes in apparent capacitance of parallel coupled electrodes 441-443 caused by the approach of input element 38 (e.g., a finger, stylus or ear) via sensed voltage output 67 to, for example, filter 76 of detections system 70 of FIG. 7. Arrangement 60' of FIG. 6 is substantially similar to arrangement 60 of FIG. 5 and operates in generally the same manner. Accordingly, the discussion of arrangement 60 is generally relevant to arrangement 60'. Arrangements 60 and 60' differ in that substantially all electrodes 441-445 of arrangement 60' are coupled in parallel to drive-sense lead 65 of PROX DR & SENSE element 66 so that they act cooperatively. Local ground is represented by element 51' analogous to element 51 of FIG. 4. Electric field 62' (e.g., indicated schematically by lines 375) has greater lateral extent, so that input element 38 (e.g., a finger, stylus or ear) is detectable at locations 382", 383" over greater lateral spacing 387 and/or at greater distanced 385'. Thus, the zone wherein general proximity detection is achieved is further enhanced.

General proximity detection is a very useful feature. For example, it may be used to "wake-up" a sleeping device from a low power state so as to be ready to detect inputs at specific individual electrodes or otherwise respond to the user or to an incoming signal or other input. As a further example, detecting that a cell phone is being brought into proximity to an ear (or otherwise approaching the head) may be used to prompt the cell phone to answer an incoming call or turn on the microphone in the cell phone or active some other function. As a still further example, such a "wake-up" function may also be used to turn on internal lights so as to illuminate the individual electrodes and/or portions or all of the display (if present) and/or other elements, which in a darkened or quiescent state would be difficult for the user to see or to activate. Thus, not only can overall power consumption be reduced by facilitating a sleep state and associated wake-up function, but overall usability can be enhanced with little or no additional power consumption by, for example, turning on the internal electrode lights, display screen or other elements, answering an incoming call or turning on an internal microphone or other features and so forth, when an input command or call or equivalent directive is about to be received. Thus, the availability of general proximity detections can be a significant advantage.

Figure 7:
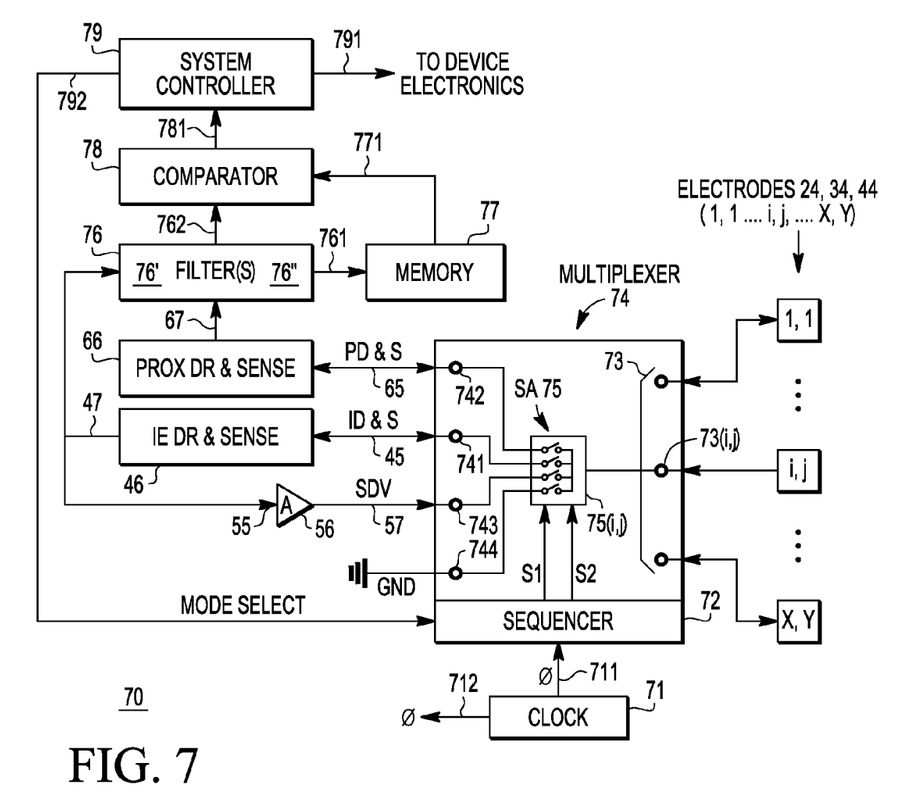
FIG. 7 is a simplified schematic block diagram of an electronic system for incorporating a proximity detection function using combinations of already available individual input electrodes.
Figure 8:
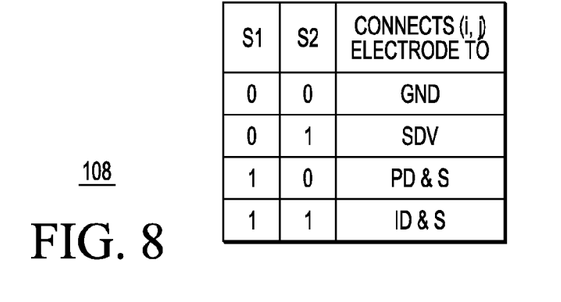
FIGS. 8-10 are truth-tables illustrating a method by which the system of FIG. 7 automatically switches between: (a) sensing the state of an individual electrode, and (b) proximity detection using a combination of such individual electrodes so as to respond to both types of inputs.
Figure 9:
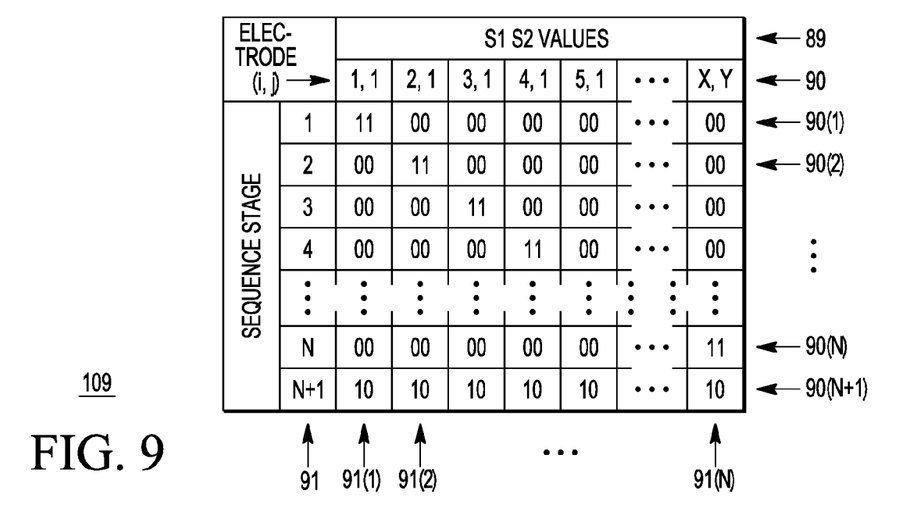
Figure 10:
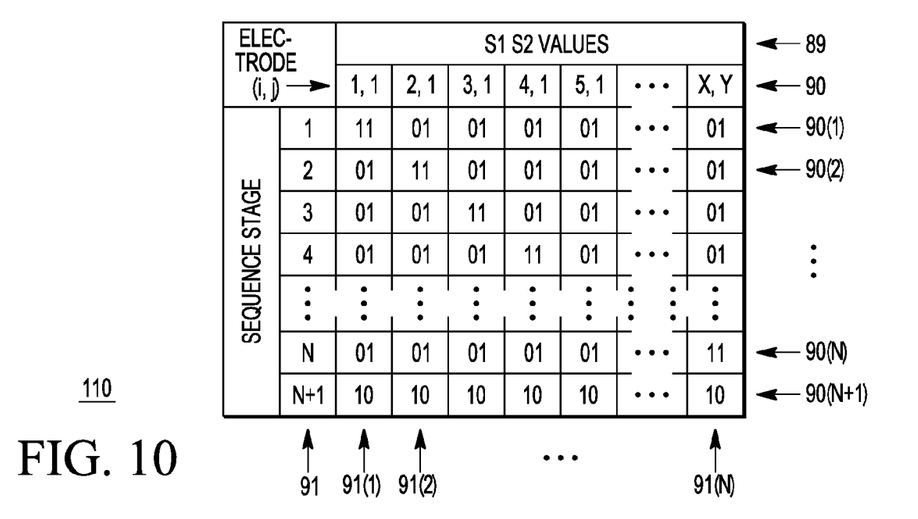

FIG. 7 is a simplified schematic block diagram of electronic system 70 for incorporating a proximity detection function using combinations of already available individual input electrodes 44 and FIGS. 8-10 show truth-tables 108-110 illustrating a method by which system 70 of FIG. 7 automatically switches between sensing the state of individual electrodes 44 and a general proximity detection function using a parallel connections of such individual electrodes 44 or both. System 70 is able to establish any of the configurations illustrated in FIGS. 3-6 and automatically accommodates both a general proximity sensing mode (e.g., as in FIGS. 5-6) and an individual electrode sensing mode (e.g., as in FIGS. 3-4) and combinations thereof. System 70 comprises clock 71, sequencer 72 associated with multiplexer (MUX) 74, amplifier 56, individual electrode driver and sense (IE DR & SENSE) element 46, proximity driver and sense (PROX DR & SENSE) element 66, filter 76, memory 77, comparator 78, and system controller 79. Filter 76 receives the sensed voltage signals from IE DR & SENSE element 46 and from PROX DR & SENSE element 66 as explained in connection with FIGS. 3-6. Filter 76 is preferred but may be omitted in other embodiments or its function may be achieved in other conventional ways. As indicated in FIG. 7, filter 76 may be a single filter shared by both IE DR & SENSE element 46 and PROX DR & SENSE element 66, or may comprise separate filters 76', 76" one for each of elements 46, 66 each providing outputs 761, 762. Either arrangement is useful. Individual filters 76', 76" are referred to collectively as filter 76. Filter 76 is conventional and functions as a low pas filter that strips off higher frequency noise that may be present on the signals coming from drive-sense elements 46, 66. Output 761 from filter 76 is coupled to memory 77 and output 762 is coupled to comparator 78. Memory 77 stores the output of filter 76 for one or more drive-sense cycles and then delivers these stored values to comparator 78. In comparator 78, the last sense voltage signal (e.g., from output 47 from IE DR & SENSE element 46 via filter 76) for an individual input electrode 24, 34, 44 or the last sense voltage signal (e.g., from output 67 from PROX DR & SENSE element 66 via filter 76) for a collection of input electrodes 23, 24, 44 are compared with their respective earlier values (provided over link 771 from memory 77) to determine whether a change in sensed voltage (and therefore a perturbation in the electric field and apparent capacitance) has occurred as a result of an input element (e.g., element 38 of FIGS. 3-6) approaching or contacting such individual electrode or group of electrodes. Filter 76, memory 77 and comparator 78 act cooperatively to compare currently sensed-voltage readings with immediate past readings for the corresponding input elements or to compare currently sensed-voltage readings to a weighted average or other integrated (e.g., smoothed) functions of various past readings, according to the type of comparison function desired by the system designer or user. Techniques for accomplishing such comparison functions are well known in the art. Based on the threshold criteria built-into filter 76 or comparator 78 and comparison criteria built into memory 77 and comparator 78, comparator 78 provides output 781 to system controller 79 indicating whether an input element is approaching or has contacted a particular input electrode or, for general proximity sensing or other purposes, a group of input electrodes. System controller 78 passes on the recognized input electrode proximity or touch to the remainder of the device for appropriate action consistent with whichever input electrode or group of electrodes has been approached or touched or both. The details of system controller 79 and the remainder of the device will depend upon the particular device being created (e.g., a cell phone, PDA, entertainment device, etc., as have been mentioned earlier) and are within the skill of the designer of such devices. As is explained in more detail later, system controller 79 can also under appropriate circumstances send a signal back to sequencer 72 via MODE SELECT output 792 to change the action of multiplexer 74 to better identify the prospective target of an approaching input element and perform other specialized functions. This is discussed in more detail in connection with FIGS. 9 and 10.

IE DR & SENSE element 46 provides (via output 45 coupled to I/O connection 741 of MUX 74) individual electrode drive current to and senses the resulting voltage building up (collectively the ID&S signals) on the individual electrode to which it is connected by switch array (SA) 75 of multiplexer (MUX) 74. PROX DR & SENSE element 66 provides (via output 65 coupled to I/O connection 742 of MUX 74) drive current to and senses the resulting voltage (collectively the PD&S signals) building up on the combination of electrodes to which it is connected by SA 75 of MUX 74. As explained in connection with FIG. 4, output 47 of IE DR & SENSE element 46 is also coupled to input 55 of amplifier 56 whose output 57 is coupled to I/O connection 743 of MUX 74. Output 57 is an amplified version of the detected voltage portion of the ID&S signal of a particular individual electrode being sensed. This amplified signal is also referred to as the shield drive voltage (abbreviated as "SDV"). Since amplifier 56 is conveniently an operational amplifier, its SDV output 57 matches the voltage signal being sensed on the individual electrode to which IE DR & SENSE element 46 is coupled by MUX 74. I/O connection 744 of MUX 74 is coupled to GND. I/O ports 73 are coupled to the individual electrodes 24, 34, 44 of device 20 or 30 of FIGS. 1-2 and/or portions 40, 50, 60, 60' of FIG. 3-6. In general, there are as many I/O ports 73 as electrodes (1,1) ... (i,j) ... (X,Y) in the device. Switch array (SA) 75 couples one or more of I/O ports 73 leading to and from individual electrodes 24, 34, 44 to I/O ports 741, 742, 743 and/or 744 as indicated in tables 108-110 of FIGS. 8-10. In order to avoid unduly cluttering FIG. 7, only one switch (e.g., switch 75(i,j)) of switch array (SA) 75 is illustrated in FIG. 7, but persons of skill in the art will understand that equivalent units are provided so as to be able to couple any combination of one or more individual electrodes (1,1) ... (i,j) ... (X,Y) to any combination of one or more I/O ports 741, 742, 742, 744.

Clock 71 of system 70 provides timing signals Θ to sequencer 72 of multiplexer (MUX) 74 via clock output 711 and to such other elements of system 70 as may also use a timing signal via output 712. The individual connections of timing signals Θ to other elements of system 70 are omitted to avoid cluttering the drawing and obscuring the invention, since clock distribution arrangements are well known in the art and within the competence of persons of ordinary skill in electronic design. What is desirable however, is that the timing signals Θ be sufficiently rapid so that the individual electrode and general proximity and/or contact detection functions provided by system 70 occur in a time period less than the time period in which humans can provide input signals to the device, for example, less than the time it takes a finger, stylus or ear to approach and/or touch electrodes 24, 34, 44. Sequencer 72 generates logical control signals S1, S2 (see tables 108-110 of FIGS. 8-10) preferably regulated by the timing signals Θ from clock 71. Logical control signals S1, S2 are fed to switch array (SA) 75, one of which (e.g., representative switch 75($i,j$)) is shown in MUX 74.

As shown in table 108 of FIG. 8, logical control signals S1, S2 determine which of I/O ports 741-744 having respectively ID&S, PD&S, SDV signals and GND are coupled by SW 75($i,j$) to I/O port 73($i,j$) leading to individual electrode i,j. S1, S2 can take on the logical values, 11, 10, 01, or 00 where the 1 and 0 indicate opposite binary states. (Even though a comma is used between S1, S2, no comma is used between the logical state designators 11, 10, 01 and 00 to avoid confusion with the identification of individual electrodes, e.g., 1,1, 2,1, . . . etc., where a comma has been used to separate the row and column identifiers). It will be understood that sequencer 72 in combination with SA 75 can couple any of the 1,1 . . . i,j, . . . X,Y electrodes 24, 34, 44 to any combination of I/O ports 741-744 having, respectively ID&S, PD&S, SDV signals and GND.

It is desirable, that individual electrodes i,j be coupled sequentially via I/O ports 73($i,j$) individually and in combination through switches 75($i,j$) to I/O ports 741-744. To couple electrodes sequentially means to couple them one after the other. This sequential coupling may be done in any desired order. How this is accomplished in a preferred embodiment is illustrated in tables 109-110 of FIGS. 9-10. Referring now to table 109 of FIG. 9, the various electrodes 1,1 . . . i,j, . . . X,Y are identified in row 90 near the top of table 109 below the label "S1, S2" in row 89, one electrode i,j in each column 91(1) . . . 91(N), where N=X*Y. For example, electrode 1,1 is listed at the top of column 91(1), electrode 2,1 at the top of columns 91(2), and so forth through electrode X,Y at the top of column 91(N). Each row 90(1) through 90(N) and 90(N+1) of table 109, where N=X*Y, below electrode identification row 90 identifies the sequence stage in column 91 and the logical states S1, S2 (e.g., 11 or 10, 01 or 00 in table 109) in columns 91(1) . . . 91(N) sent by sequencer 72 to switch 75($i,j$) corresponding to the electrode i,j being addressed in particular drive-sense stage 1 thru N and N+1 listed in column 91 near the left edge of table 109. In the example of table 109, each electrode 1,1 . . . i,j, . . . X,Y is individually coupled, one at a time, to one or more of I/O ports 741-744 in sequential stages 1 thru N, and collectively coupled in further stage N+1. For example, in stage 1 in row 90(1), first electrode 1,1 in column 91(1) is coupled to ID&S I/O port 741 as indicated by the logical state 11 in the 1,1 (i.e., 91(1)) column of row 90(1) and all other electrodes 2,1 . . . X,Y (e.g., in columns 91(2) . . . 91(N)) are coupled to GND port 744 as indicated by logical state 00 in the remainder of entries in row 90(1). In stage 2 in row 90(2), electrode 1,1 in column 91(1) is coupled to GND port 744 as indicated by logical state 00 in the 1,1 (i.e., 91(1)) column of row 90(2), second electrode 2,1 in column 91(2) is coupled to ID&S I/O port 741 as indicated by the logical state 11 in the 2,1 (91(2)) column of row 90(2), and all other electrodes 3,1 . . . X,Y in columns 91(3) . . . 91(N) are coupled to GND port 744 as indicated by logical state 00 in the remainder of entries in row 90(2). This same pattern is followed in this example, through stage N=X*Y wherein last electrode X,Y is coupled to ID&S I/O port 741 as indicated by the logical state 11 in the X,Y (i.e., 91(N)) column of row 90(N) and all other electrodes 1,1 in column 91(1) through electrode X–1,Y–1 in column 91(N–1) (not shown in table 109) are coupled to GND port 744 as indicated by logical state 00 in the remainder of entries in row 90(N). While table 109 has the various electrodes i,j arranged in increasing order, this is merely for convenience of explanation and in other embodiments, any order may be used. When all of the individual electrodes 1,1 . . . i,j . . . X,Y have been individually coupled as shown in table 109 in stages 1 through N, then in stage N+1, electrodes 1,1 . . . i,j . . . X,Y are parallel coupled to PD&S I/O port 742 as indicated by the logical state 10 in columns 91(1) thru 91(N) of row 90(N+1) of stage N+1. This has the effect of coupling all of electrodes 24, 34, 44 in configuration 60' of FIG. 6 (or configuration 60 of FIG. 5 with outer electrodes 444-445 grounded by use of logical state 00 therefore) and provides an effective large area proximity detection capability since all or nearly all electrodes contribute to the effective proximity element area. This is highly desirable for general proximity sensing. In the example of table 109, all electrodes are coupled in parallel to PD&S I/O port 742, but this is intended merely to be exemplary and not limiting. In other embodiments, less than all input electrodes may be parallel coupled to form the proximity detection electrode. When the drive-sense step of stage N+1 is completed, and sensed-voltage output 67 of PROX DR & SENSE element 66 is coupled to filter 76, then system 70 returns to stage 1 and recycles through stages 1 thru N+1 again, repeating this as long as it is desired to detect proximity or contact to individual electrodes and/or to the combined electrodes for general proximity detection. Each repeat of stages 1 through N+1 is referred to as a drive-sense cycle. While the foregoing explanation describes the individual input electrodes as being coupled individually and then collectively to drive-sense elements 46 or 66, in further embodiments, the input electrodes may also be parallel-coupled in various subgroups of less than all the input electrodes to accomplish various other functions desired by the designer and/or user. Such sub-groupings may be built into sequencer 72 or programmable, as for example, via mode select control 792 from system controller 79. An example of such arrangement is given in connection with the discussion of FIGS. 9-10.

As noted in connection with the discussion of clock signal Θ, it is desirable that the time required to cycle from stages 1 thru N+1 (the overall drive-sense cycle time) be less than the approach time of input element 38 (e.g., a finger, stylus or ear). For example, using a square wave constant current drive to charge the effective capacitance of electrodes 1,1 though X,Y and then sense the voltage attained after a predetermined first interval (e.g., the constant current duration or square wave ON interval)), it is desirable that this duration $T_{ON}$ be less than or equal to about 32 microseconds, more conveniently less than or equal to about 1.0 microseconds and preferably less than or equal to about 0.5 microseconds. The time required to sense the achieved voltage does not add significant time. It is desirable that a second approximately equal interval $T_{OFF}$ is provided after the constant current drive and voltage sense is complete to allow the voltage to return substantially to zero before another drive-sense stage is initiated on another input electrode. The time required for MUX 74 to switch to the next input electrode is also negligible, so the total time per drive-sense stage $T_{PerStage}$ for each individual input electrode or group of electrodes in table 109 is about $T_{PerStage}=T_{ON}+T_{OFF}$. It has been found that $T_{PerStage}$ is usefully about 64 microseconds, more conveniently about 2 microseconds and preferably about 1.0 microsecond. The total or overall drive-sense time TT to cycle through all N+1 stages is then TT=(N+1)*$T_{PerStage}$.

It takes a human typically about $T_H$=80 milliseconds seconds to move input element 38 (e.g., a finger, stylus or ear) in such a way as to significantly influence an individual electrode or composite proximity electrode, that is, to significantly change the apparent capacitance. Since the individual input electrode drive-sense time per stage $T_{PerStage}$ is very small compared to human reaction time, a very large number N of individual electrodes can be accommodated and still have the total drive-sense time for the whole input electrode array TT=(N+1)*$T_{PerStage}$ be significantly less than the human reaction time. A long as TT is less than $T_H$ it will appear to the user that the device is responding to any input electrode approach or contact without significant delay, both for general proximity purposes as well as individual electrode proximity or contact purposes. For example, as input element 38 (e.g., a finger, stylus or ear) begins to approach device 20, 30, it will be detected during the proximity stage (e.g., stage N+1) of each array drive-sense cycle (states 1 through N+1) before it can come into contact with any electrode i,j, and the device actuated as desired by the designer, e.g., electrode array lights turned on, phone answered or whatever. As input element 38 (e.g., a finger, stylus or ear) continues to approach, other wake-up functions or call answering functions can be executed as the increased proximity of the input element is detected during subsequent overall array drive-sense cycles. Stated another way, by using the arrangement illustrated above and providing total array drive-sense cycle time TT less than about 80 milliseconds, more conveniently less than about 16 milliseconds and preferably less than about 1 millisecond, the device will appear to function as if it had a large area independent proximity detection element, when in fact it does not, and the proximity detection function is being achieved by rapidly multiplexing a large number or all of the individual input electrodes together in real time for proximity sensing and then returning them to individual (or subgroup) sensing mode until all have been scanned, and then repeating the multiplexed and individual (or subgroup) scanning steps during the next overall drive-sense cycle. Thus, a general proximity function can be provided for devices that otherwise have no space for a large area dedicated general proximity sensing element. Further, the invented embodiments can provide general proximity sensing at lower cost even in situations where adequate space may be available for such a large area dedicated proximity sensing electrode because the cost of such a large area dedicated electrode is avoided. Still further, the above-described embodiments can accommodate a very large number N≦($T_H$/$T_{PerStage}$)−1 of input electrodes. For the values given above N≦($T_H$/$T_{PerStage}$)−1=((80E−3)/(64E−6))−1, whereby N can exceed about 1000 input electrodes and still satisfy the desired conditions.

A further embodiment of the invention is illustrated in table 110 of FIG. 10. Table 110 of FIG. 10 is very similar to table 109 of FIG. 9, except S1, S2 inputs to determine the logical state of switches 75(i,j) of array 75 are modified so that that instead of coupling various electrodes i,j during stages 1 through N to GND port 744, as shown by the 00 entries in table 109 of FIG. 9, in table 110, such entries are replaced by logical state 01 so that such i,j electrodes are coupled (per table 108) to shield drive voltage (SDV) input port 743. This places the devices in the configuration illustrated in arrangement 50 of FIG. 4, wherein the electrode being sensed is surrounded by or adjacent to shield electrodes driven to the same voltage as is being sensed. This greatly increases the positional accuracy of proximity sensing of individual electrodes. In table 110 it is assumed that all non-sensed electrodes are coupled to SDV port 743, but this is merely for convenience of explanation and not intended to be limiting. Any subset of non-sensed electrodes may be coupled to SDV port 743 and the remainder left floating or grounded to port 744 or combined with the sensed electrode, as desired by the device designer or user. Either arrangement is useful.

In a still further embodiment, as input element 38 (e.g., a finger, stylus or ear) is detected approaching a particular subset or region of input elements 23, 24, 44, as for example, while system 70 is in the configuration 109, and while the destination input element may as yet be unclear, then system 70 can in this further embodiment switch to configuration 110 and vary the combinations of sensed electrodes and surrounding SDV coupled electrodes to narrow the positional identification of the target electrode intended by input element 38 (e.g., a finger, stylus or ear). By way of illustration, assume that input element 38 is detected as being in the vicinity of four neighboring input electrodes (the "proximate electrodes") arranged, for example, in a square, where the apparent capacitance changes due to the input element approach are not sufficient to allow a clear determination of which of the four proximate electrodes is intended as the target. Then system 70 can, using an arrangement similar to that illustrated in table 110 and FIG. 4, chose each of the four proximate electrodes in turn as sensed electrode 441 coupled to port 741 and surrounded by electrodes coupled to SDV port 743, thereby forming configuration 50 of FIG. 4 in two dimensions. By comparing the relative capacitances of each of the four combinations, the intended target input electrode can be better identified because of the improved spatial detection capabilities associated with configuration 50, especially when executed in two dimensions. Any number of proximate electrodes greater than or equal to two input electrodes can be sampled in this way to improve the positional accuracy of proximate input electrode detection. Further, the input electrodes being sampled surrounded by or adjacent to SDV coupled electrodes need not be arranged in a square but may be in any other geometric configuration depending on the number of proximate electrodes involved. Non-limiting examples of such other arrangements are input electrodes arranged in a line, a cross, a polygon, a rectangle, a circle or ellipse or other arbitrary geometrical configuration. Thus, in these further embodiments, the particular embodiment, e.g., arrangements 40, 50, 60, 60' and/or the configurations of tables 109 or 110, are not fixed but can be varied during the course of the approach of an input element, and the number of individual electrodes arranged in groups dynamically varied to improve the overall functioning of the device. This is a further important advance in the art.

Figure 11:
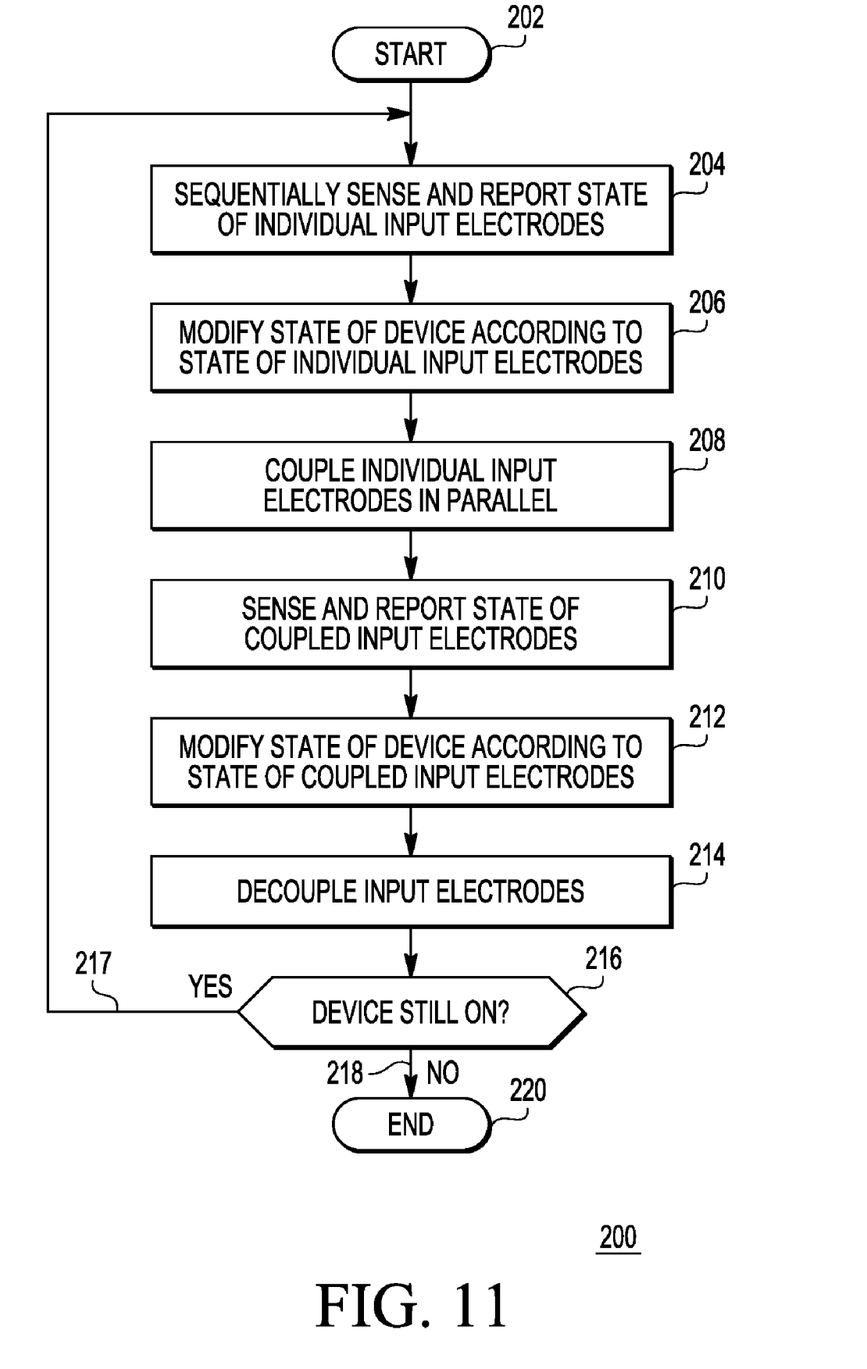
FIGS. 11-13 are simplified schematic block diagrams illustrating methods for sensing the state of various individual, group and general proximity input electrodes combinations and modifying the state of the devices of FIGS. 1-2 based thereon, according to still further embodiments of the invention.
Figure 12:
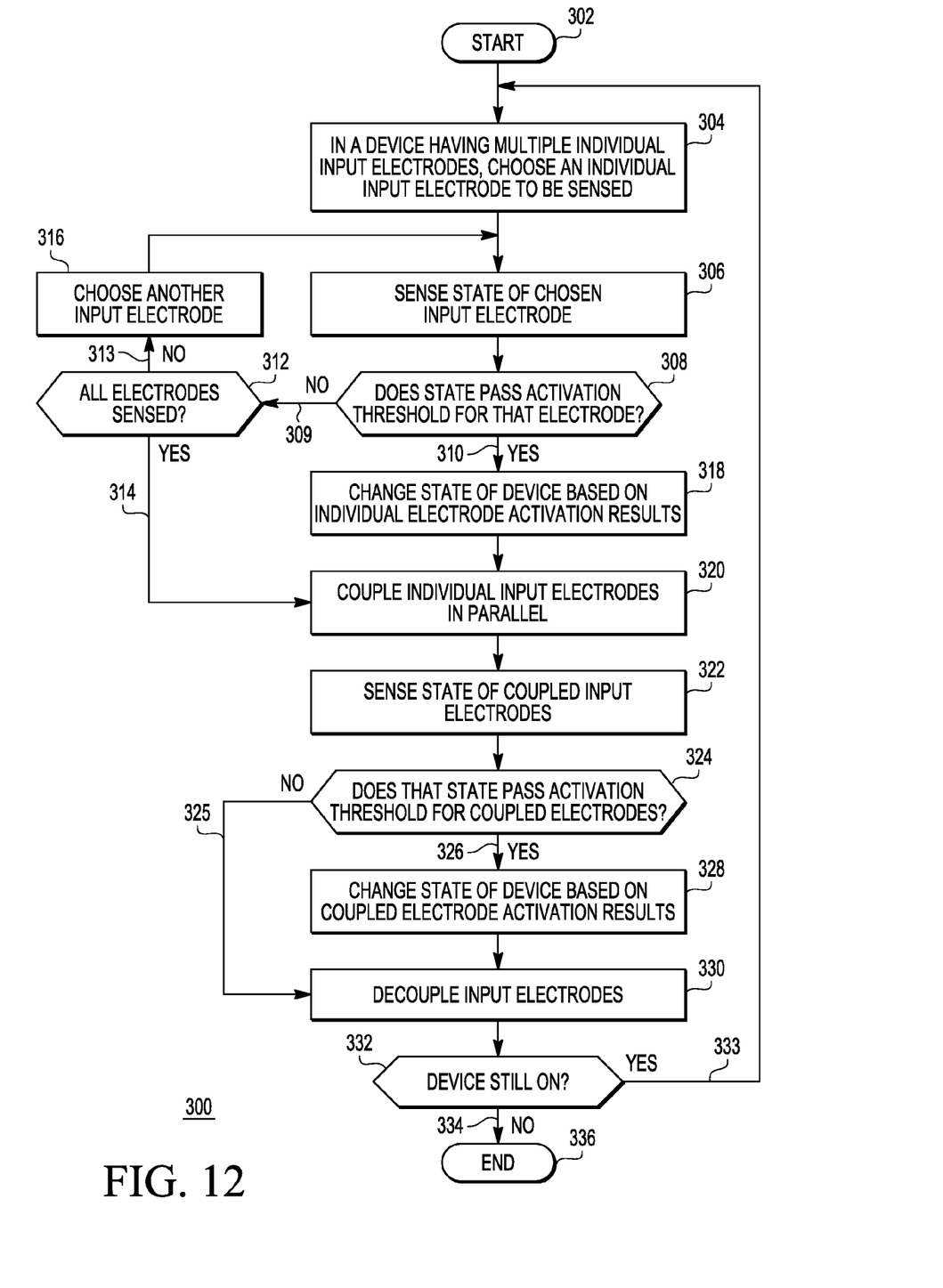
Figure 13:
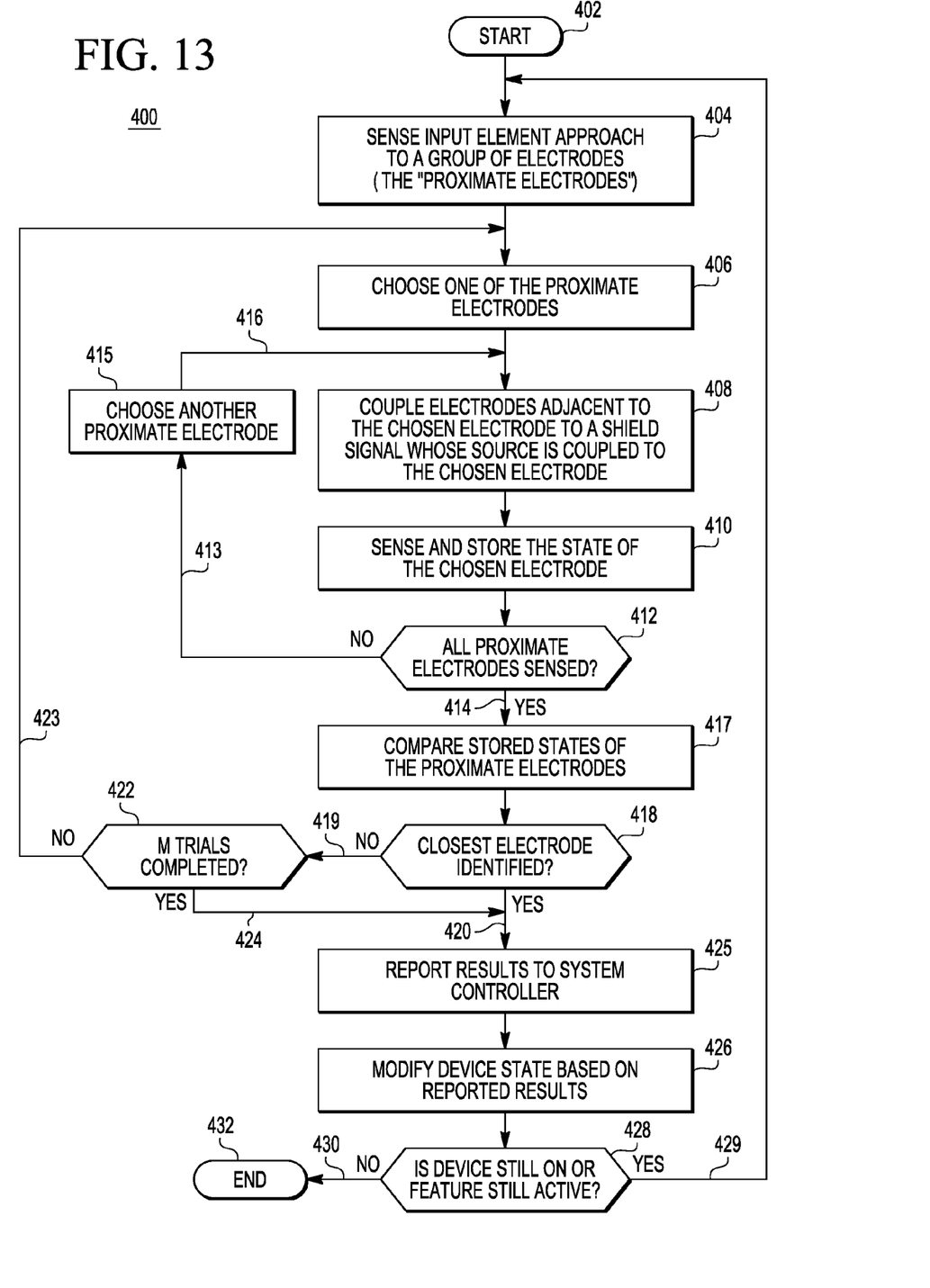

FIGS. 11-13 are simplified schematic block diagrams illustrating methods 200, 300, 400 for sensing the state of various combinations of individual, group and general proximity input electrode 23, 24, 44 and modifying the state of devices 20, 30 of FIGS. 1-2 based thereon, according to yet further embodiments of the invention. Methods 200, 300, 400 are executed by system 70 of FIG. 7, keeping in mind the various input electrode arrangements illustrated in FIGS. 3-6 and further explained in connection with FIGS. 8-10. Referring now to FIG. 11, method 200 begins with START 200 and initial step 204 that can occur when device 20, 30 is powered up. In initial step 204, individual input electrodes 1,1 . . . i,j . . . X,Y are sensed one at a time as has been explained in connection with FIGS. 3-4 and 7-9 or 3-4, 7-8 and 10, and the result of such sensing operations reported to system controller 79, which in step 206, modifies (i.e., changes or alters) the state of devices 20, 30 via output 791 if a change in state of the sensed electrode has been detected. For example, if system 70 determines that input electrode i,j has received a valid input (either by proximity or actual or virtual touch), where input electrode i,j is, for instance, part of a numerical keypad, then the value ascribed to input key i,j is entered into the device electronics via controller output 791. Similarly, each individual input electrode is tested (e.g., sequentially sensed) in turn, as been described for example in connection with FIGS. 8-9, to determine whether or not a valid input has been received and each such input or lack thereof is reported to device 20, 30 for appropriate action corresponding to which input(s) have been activated or not activated. When step 206 has been completed for the individual input electrodes, method 200 proceeds to step 208 in which some or all individual input electrodes are coupled together in parallel to form a large area proximity sensing element, as has been described in connection with FIGS. 5-6 and step N+1 of FIG. 9 or 10. In step 210, the parallel combinations of some or all of electrodes 24, 34, 44 is sensed and the result reported in substantially the same manner as for the individual electrodes as has already been explained in connection with the discussion of FIGS. 5-9 and/or 5-8 and 10. In step 212 the state of device 20, 30 is modified or not according to the results of step 210, as for example, turning on the lights under the input keys or answering a cell phone incoming call or whatever, when the proximity detect mode of stage N+1 of FIG. 9 or 10 has detected an approaching input element (e.g., a finger, stylus or ear). Following completion of step 212, then in step 214, the parallel coupled input electrodes arranged in step 208 are decoupled so as to be ready to return to the individual input electrode sensing mode following subsequent query 216. In query 216, it is determined whether or not device 20, 30 is still ON, that is still activated. If the outcome of query 216 is YES indicating that device 20, 30 is still powered up, then as shown by path 217, method 200 returns to initial step 204 and steps 204-214 repeated until the outcome of query 216 is NO, whereupon as shown by path 218, method 200 proceeds to END 220. The combinations of steps 204-206 and 208-214 may be performed in any order, that is, the individual electrodes may be sensed in any order and the device state modified accordingly, and the individual electrodes may be grouped in any combination and sensed and the state of the device modified accordingly, etc., before or after the individual electrodes are sensed, etc.

Referring now to FIG. 12, method 300 begins with START 302 and initial step 304. In initial step 304, in a device having multiple individual input electrodes 24, 34, 44, an individual input electrode (e.g., electrode i,j) is chosen to be sensed, as has been described in connection with FIGS. 3-4, 7-9 or 3-4 and 7-9 and 10. In step 306, the state of the chosen input electrode is sensed, that is, it is determined, for example by measuring the voltage response when input electrode i,j is driven by a constant current or other charge source, whether the apparent capacitance (e.g., sensed by the voltage rise) of the electrode indicates that an input element is near or in contact with input electrode i,j, as has been previously explained. In query 308 it is determined, for example using a combination of IR DR & SENSE element 46, filter 76, memory 77 and comparator 78, whether or not the sensed signal on input electrode i,j (that is the "state" of electrode i,j) indicates that the activation threshold for such input electrode has been passed. If the activation threshold has been passed (e.g., YES outcome of query 308), then the input element (e.g. a finger, stylus or ear) is considered to have activated input i,j, and if the activation threshold has not been passed (e.g., NO outcome of query 308), then the input element (e.g., finger, stylus or ear) approaching or touching input electrode i,j is considered to not have activated electrode i,j. If the outcome of query 308 is NO, then method 300 proceeds via path 309 to query 312 wherein it is determined whether or not all electrodes 1,1 . . . i,j . . . X,Y have been sensed. If the outcome of query 312 is NO, then as shown by path 313, method 300 proceeds to step 316 wherein another input electrode (e.g., i+1,j+1) is chosen and method 300 then proceeds back to step 306 so that the sequence of steps 306-308 is repeated until a YES outcome is obtained from either query 308 or 312. If the outcome of query 308 is YES, then as shown by path 310, method 300 proceeds to step 318 wherein the state of the device (e.g., device 20, 30) is changed based on the activation of the individual electrode by approaching or contacting input element 38 (e.g., a finger, stylus or ear). For example, if in a key-pad, the input electrode corresponding to the + sign has been activated, then system controller 79 issues an "ADD" instruction via output 791 to the device electronics. On completion of step 318 or if the outcome of query 312 is YES leading to path 314, then method 300 proceeds to step 320 in which some or all of the individual input electrodes 24, 34, 44 are coupled in parallel, as for example is illustrated in step N+1 of FIG. 9 or 10 and/or in FIGS. 5-6. In subsequent step 322, the state of the parallel coupled input electrodes is sensed as has already been described in connection with FIGS. 5-7. In further query 324, it is determined whether or not the state of the parallel coupled electrodes passes the activation threshold for general proximity detection. This is accomplished in generally the same manner as has already been explained in connection with FIGS. 5-7 for general proximity detection and in connection with step 308 for an individual electrode. If the outcome of query 324 is NO, then as shown by path 325, method 300 proceeds to decoupling step 330. If the outcome of query 324 is YES, then method 300 proceeds via path 326 to step 328 in which the state of the device (e.g., device 20, 30) is changed based on the general proximity activation determined in step 324, before proceeding to decoupling step 330 wherein the parallel coupled input electrodes are decoupled in preparation for a return to the individual input electrode sensing mode of steps 304 and following. Following decoupling step 330, method 300 proceeds to query 332 wherein it is determined whether or not the device is still ON (e.g., still powered up). If the outcome of query 332 is YES, then method 300 proceeds via path 333 to initial step 304 and the sequential individual input sense plus parallel coupled input electrodes sense cycle is repeated until the outcome of query 332 is NO, whereupon method 300 proceeds via path 334 to END 336.

FIG. 13 illustrates method 400 by which the destination of an input element (e.g., a finger or stylus) may be more accurately anticipated, as has been previously mentioned in connection with the discussion of FIGS. 7 and 10. Reference should also be had to arrangement 50 of FIG. 4, system 70 of FIG. 7 and table 110 of FIG. 10. Method 400 begins with START 402 and initial step 404, in which input element 38 (e.g., a finger, stylus or ear) is sensed approaching a group of individual input electrodes. This situation can arise when a subset of individual input electrodes has been grouped together or where, for example, the situation resembles arrangement 40 of FIG. 3 wherein it may not be possible to uniquely determine the spatial position of input element 38 relative to the underlying input electrodes (e.g., electrodes 441-443). These nearby electrodes are referred to as the "proximate electrodes" and may comprise any number of individual input electrodes, generally adjacent and grouped in some fashion, as for example, arranged in the form of a square, rectangle, polygon, circle, ellipse, triangle, line, cross, and so forth. The precise two dimensional layout in which the proximate electrodes are arranged is not critical. In step 406 of method 400, system controller 79 issues a mode change instruction on output 792, whereupon sequencer 72 and MUX 74 of system 70 selects one of the proximate electrodes (e.g., electrode i,j) as the sensed electrode coupled to ID&S input 741 of FIG. 7 from IE DR & SENSE element 46. Surrounding or adjacent electrodes (including in other embodiments some electrodes beyond the proximate electrodes) are coupled to SDV input 743 of FIG. 7, so that such non-sensed electrodes act as a driven shield coupled via amplifier 56 to voltage sense output 47 of IE DR & SENSE element 46. Thus, the voltage of such driven shield electrodes follows the voltage of sensed element i,j and the electric field associated with electrode i,j is highly localized (e.g., see FIG. 4) so that it may more accurately respond to approaching input element 48. In step 410, the state of sensed electrode I,j is determined and stored in memory 77, as has already been explained in connection with the discussion of one or more of FIGS. 3-10. In following query 412 it is determined whether or not all of the proximate electrodes have been sensed and their state stored in memory 77. (In other embodiments, rather than all results being stored, only those passing a predetermined significance threshold may be stored.). If the outcome of query 412 is NO, then as shown by path 413, method 400 proceeds to step 415 in which another of the proximate electrodes is chosen as the sensed electrode and steps 408-412 repeated until all proximate electrodes have been sensed using the configuration of arrangement 50 of FIG. 4 and the significant results stored in memory, that is, until the outcome of query 412 is YES. Method 400 then proceeds to step 417 wherein the stored state values for the various proximate electrodes are compared so that the proximate electrode most perturbed by incoming input element 38 and therefore the closest thereto can be identified. In query 418 it is determined whether or not the closest electrode to the input element can be identified. If the outcome of query 418 is NO, then method 400 proceeds via path 419 to query 422 wherein it is determined whether a predetermined number M of trials has been completed. The purpose of this query is to prevent system 70 from becoming trapped in an endless loop in case no single input electrode is determined to be the closest to approaching input element 38. If the outcome of query 422 is NO, indicating that the maximum number M of trials has not been reached, then method 400 loops back via path 423 to steps 406-418 and tries again, seeking to identify the closest electrode to input element 38. This loop continues until a YES outcome is obtained from either query 418 (closest electrode identified) or query 422 (trial limit reached) whereupon method 400 proceeds to step 425 in which the results of the proceeding steps are reported to system controller 79. This may be, for example, the identification of the input electrode closest to approaching input element 38 (e.g., a finger, stylus or ear) or the group of input electrodes closest to input element 38. The latter situation can occur, for example, when the input element is equally spaced from several input electrodes. This information can be effectively used by the device (e.g., device 20, 30) in step 426 wherein the state of the device is modified based on the results reported in step 425, assuming that the results differ significantly from a predetermined action threshold. For example, the device can use in step 426 the information provided in step 425 to light the input electrode or small group of input electrodes closest to the approaching input element, thereby leading the user into the desired input electrode. This is an example of how the method 400 in cooperation with system 70 may be used to enhance the user friendliness and utility of device 20, 30 and analogous devices having a significant number of input electrodes. Following step 426, method 400 can proceed to query 428 in which it is determined whether the device is still ON or the described feature still active?. If the outcome of query 428 is YES, then method 400 can proceed via path 439 back to initial step 404 and the sequence repeated until the outcome of query 428 is NO, whereupon method 400 proceeds to end 432. The capability illustrated in method 400 may be always ON (e.g., active whenever device 20, 30 is powered up) or may be selected by an appropriate ON/OFF switch, in which case query 428 checks to see whether this switch is in the ON of OFF position. Either arrangement is useful.

According to a first embodiment, there is provided a method (200, 300, 400) for providing proximity detection in an electronic device (20, 30) having multiple individual input electrodes (24, 34, 44), comprising, sensing and reporting the state of the individual input electrodes (24, 34, 44), modifying the state of the device (20, 30) according to the state of the individual input electrodes (24, 34, 44), coupling some or all of the multiple individual input electrodes (24, 34, 44) together in parallel, sensing and reporting the state of the coupled input electrodes (24, 34, 44), modifying the state of the device (20, 30) according to the state of the coupled input electrodes (24, 34, 44) and de-coupling the coupled input electrodes (24, 34, 44). In a further embodiment, the sensing, reporting and modifying steps for the individual input electrodes, comprise, choosing an individual input electrode (24, 34, 44) to be sensed, sensing the state of the chosen input electrode (24, 34, 44) by measuring a signal (47) affected by the approach or contact of an input element (38) to the chosen input electrode (24, 34, 44), testing whether the measured signal (47) passes a predetermined threshold, and if YES, changing the state of the device (20, 30), and if NO, choosing another individual input electrode (24, 34, 44) and repeating the sensing and threshold testing steps until all input electrodes (24, 34, 44) of interest have been chosen, sensed and threshold tested. In a still further embodiment, when the sensing, reporting and modifying steps for the individual input electrodes (24, 34, 44) indicate that an input element (38) is in the vicinity of more than one input electrode (24, 34, 44), the method further comprises, first choosing one of the more than one input electrodes (24, 34, 44) as the first chosen input electrode (24, 34, 44) to be sensed and coupling others of the more than one input electrodes (24, 34, 44) to a driven shield signal (57) derived from the first chosen input electrode (24, 34, 44), first sensing and reporting the state of the first chosen input electrode (24, 34, 44), and second choosing another of the one or more input electrodes (24, 34, 44) as a second chosen input electrode (24, 34, 44) to be sensed and coupling others of the more than one input electrodes (24, 34, 44) to a driven shield signal (57) derived from the second chosen input electrode (24, 34, 44), second sensing and reporting the state of the second chosen input electrode (24, 34, 44), and repeating the first and second choosing, sensing and reporting steps until all of the more than one input electrodes (24, 34, 44) have been chosen, sensed and reported while the others of the more than one input electrodes (24, 34, 44) have been coupled to a driven shield signal (57) derived therefrom, and comparing the reported results to determine which of the more than one input electrodes (24, 34, 44) is closest to the input element (38). In a yet further embodiment, the step of sensing the state of the individual input electrode (24, 34, 44) comprises, driving the individual input electrode with a constant current and measuring the voltage appearing across the individual input electrode as a result of the constant current drive. In a still yet further embodiment, the constant current drive is a constant current pulse of first predetermined duration. In a yet still further embodiment, the step of measuring the voltage occurs at a second predetermined time after the constant current drive starts. In another embodiment, the step of reporting the state of the individual input electrodes and modifying the state of the device comprise, storing a first sensed state of the individual input electrode in a memory and then comparing the stored first sensed state with a second sensed state determined later in time so as to detect changes between the first and second sensed states and modifying the state of the device based at least in part on such changes. In a still another embodiment, the step of sensing and reporting the state of the coupled input electrodes (24, 34, 44) comprises, driving the coupled input electrodes with a constant current and measuring the voltage appearing across the coupled input electrodes as a result of the constant current drive. In a yet another embodiment, the constant current drive is a constant current pulse of first predetermined duration. In a still yet another embodiment, the step of measuring the voltage occurs at a second predetermined time after the constant current drive starts.

According to a second embodiment, there is provided an apparatus (20, 30) for detecting proximity of an input element (38), comprising, multiple individual input electrodes (24, 34, 44), an individual electrode drive and sense element (46) having a drive-sense terminal (45) adapted to be coupled to the individual input electrodes (24, 34, 44) and having an output terminal (47) for reporting on the states of the individual input electrode (24, 34, 44) coupled to its drive-sense terminal (45), a proximity drive and sense element (66) having a drive-sense terminal (65) adapted to be coupled to parallel groups of the individual input electrodes and having an output terminal (67) reporting on the states of the parallel coupled groups of individual input electrodes (24, 34, 44) coupled to its drive-sense terminal (65), and a multiplexer (74) for sequentially coupling: (i) the individual input electrodes (24, 34, 44) to the drive-sense terminal (45) of the individual electrode drive and sense element (46), and (ii) the parallel coupled groups of individual input electrodes (24, 34, 44) to the drive-sense terminal (65) of the proximity drive and sense element (66). According to a further embodiment, the apparatus further comprises, a filter (76, 76') for receiving from the output terminal (47) of the individual electrode drive and sense element (46) first signals related to the states of the individual input electrodes (24, 34, 44), and a filter (76, 76") for receiving from the output terminal (67) of the proximity drive and sense element (66) second signals related to the states of the parallel coupled individual input electrodes (24, 34, 44). According to a still further embodiment, the apparatus further comprises, a memory (77) having an input coupled to an output (76I) of the filter (76, 76', 76") for temporarily storing signals determined by the states of the individual and parallel coupled individual input electrodes (24, 34, 44). According to a yet further embodiment, the apparatus further comprises, a comparator (78) receiving an input from the memory (77) and an input from the filter (76, 76', 76") for comparing the state of various individual input electrodes (24, 34, 44) singly or in groups with previous values of the states of the same or other of the various individual input electrodes (24, 34, 44) or groups of electrodes (24, 34, 44).

According to a third embodiment, there is provided a method (200, 300, 400) for providing proximity detection in an electronic device (20, 30) having multiple individual input electrodes (24, 34, 44), comprising, sensing and storing a proximity or contact state of the individual input electrodes (24, 34, 44), comparing current values of the proximity or contact state of the individual input electrodes with one or more stored values of the proximity or contact state of the same or different individual input electrodes (24, 34, 44), sensing and storing a proximity or contact state of one or more groups of the individual input electrodes (24, 34, 44), comparing current values of the proximity or contact state of the one or more groups of the individual input electrodes (24, 34, 44) with one or more stored values of the proximity or contact state of the same or different groups of the individual input electrodes (24, 34, 44), and modifying the state of the device (20, 30) according to the results of one or both comparing steps. According to a further embodiment, the sensing and storing steps for the proximity or contact state of the individual input electrodes (24, 34, 44) are performed sequentially in any order. According to a still further embodiment, the sensing and storing steps for the proximity or contact state of the one or more groups of input electrodes (24, 34, 44) are performed during or after the sensing and storing steps for the proximity or contact state of the individual input electrodes (24, 34, 44). According to a yet further embodiment, a time period used for the sensing, comparing and modifying steps for all input electrodes is less than human reaction time for approaching or contacting an input electrode. According to a still yet further embodiment, a time period for the sensing, comparing and modifying steps for an individual input electrode is less than or equal to about 64 microseconds. According to a yet still further embodiment, the step of modifying the state of the device (20, 30) comprises lighting some of the input electrodes.

According to a fourth embodiment, there is provided an electronic apparatus (20, 30), comprising, a plurality of individual input electrodes (24, 34, 44), a touch and proximity detection system (70) coupled to the plurality of individual input electrodes, wherein in a first mode, the detection system (70) provides an indication of whether or not an input element (38) has touched at least one of the individual input electrodes (24, 34, 44) and in a second mode provides an indication of whether or not an input element (38) is in proximity to a group of at least some of the individual input electrodes (24, 34, 44).

While at least one exemplary embodiment has been presented in the foregoing detailed description of the invention, it should be appreciated that a vast number of variations exist. It should be also appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for providing proximity detection in an electronic device having multiple individual input electrodes, comprising:
   sensing and reporting the state of the individual input electrodes;
   modifying the state of the device according to the state of the individual input electrodes;
   coupling some or all of the multiple individual input electrodes together in parallel;
   sensing and reporting the state of the coupled input electrodes;
   modifying the state of the device according to the state of the coupled input electrodes; and
   de-coupling the coupled input electrodes.

2. The method of claim 1, wherein the sensing, reporting and modifying steps for the individual input electrodes, comprise:

choosing an individual input electrode to be sensed;

sensing the state of the chosen input electrode by measuring a signal affected by the approach or contact of an input element to the chosen input electrode;

testing whether the measured signal passes a predetermined threshold; and if YES, changing the state of the device; and if NO, choosing another individual input electrode and repeating the sensing and threshold testing steps until all input electrodes of interest have been chosen, sensed and threshold tested.

3. The method of claim 1, wherein when the sensing, reporting and modifying steps for the individual input electrodes indicate that an input element is in the vicinity of more than one input electrode, the method further comprising:

first choosing one of the more than one input electrodes as the first chosen input electrode to be sensed and coupling others of the more than one input electrodes to a driven shield signal derived from the first chosen input electrode;

first sensing and reporting the state of the first chosen input electrode;

second choosing another of the more than one input electrodes as a second chosen input electrode to be sensed and coupling others of the more than one input electrodes to a driven shield signal derived from the second chosen input electrode;

second sensing and reporting the state of the second chosen input electrode;

repeating the first and second choosing, sensing and reporting steps until all of the more than one input electrodes have been chosen, sensed and reported while the others of the more than one input electrodes have been coupled to a driven shield signal derived therefrom; and comparing the reported results to determine which of the more than one input electrodes is closest to the input element.

4. The method of claim 1, wherein the step of sensing the state of the individual input electrode comprises, driving the individual input electrode with a constant current and measuring the voltage appearing across the individual input electrode as a result of the constant current drive.

5. The method of claim 4, wherein the constant current drive is a constant current pulse of first predetermined duration.

6. The method of claim 5, wherein the step of measuring the voltage occurs at a second predetermined time after the constant current drive starts.

7. The method of claim 1, wherein the step of reporting the state of the individual input electrodes and modifying the state of the device comprise, storing a first sensed state of the individual input electrode in a memory and then comparing the stored first sensed state with a second sensed state determined later in time so as to detect changes between the first and second sensed states and modifying the state of the device based at least in part on such changes.

8. The method of claim 1, wherein the step of sensing and reporting the state of the coupled input electrodes comprises, driving the coupled input electrodes with a constant current and measuring the voltage appearing across the coupled input electrodes as a result of the constant current drive.

9. The method of claim 8, wherein the constant current drive is a constant current pulse of first predetermined duration.

10. The method of claim 9, wherein the step of measuring the voltage occurs at a second predetermined time after the constant current drive starts.

11. An apparatus for detecting proximity of an input element, comprising:

multiple individual input electrodes;

an individual electrode drive and sense element having a drive-sense terminal adapted to be coupled to the individual input electrodes and having an output terminal for reporting on the states of the individual input electrode coupled to its drive-sense terminal;

a proximity drive and sense element having a drive-sense terminal adapted to be coupled to parallel groups of the individual input electrodes and having an output terminal reporting on the states of the parallel coupled groups of individual input electrodes coupled to its drive-sense terminal; and a multiplexer for sequentially coupling: (i) the individual input electrodes to the drive-sense terminal of the individual electrode drive and sense element, and (ii) the parallel coupled groups of individual input electrodes to the drive-sense terminal of the proximity drive and sense element.

12. The apparatus of claim 11, further comprising:

a first filter for receiving from the output terminal of the individual electrode drive and sense element first signals related to the states of the individual input electrodes; and a second filter for receiving from the output terminal of the proximity drive and sense element second signals related to the states of the parallel coupled individual input electrodes.

13. The apparatus of claim 12, further comprising:

a memory having an input coupled to an output of the first and second filters for temporarily storing signals determined by the states of the individual and parallel coupled individual input electrodes.

14. The apparatus of claim 13, further comprising:

a comparator receiving an input from the memory and an input from the first and second filters for comparing the state of various individual input electrodes singly or in groups with previous values of the states of the same or other of the various individual input electrodes or groups of electrodes.

15. A method for providing proximity detection in an electronic device having multiple individual input electrodes, comprising:

sensing and storing a proximity or contact state of the individual input electrodes;

comparing current values of the proximity or contact state of the individual input electrodes with one or more stored values of the proximity or contact state of the same or different individual input electrodes;

sensing and storing a proximity or contact state of one or more groups of the individual input electrodes;

comparing current values of the proximity or contact state of the one or more groups of the individual input electrodes with one or more stored values of the proximity or contact state of the same or different groups of the individual input electrodes; and modifying the state of the device according to the results of one or both comparing steps.

16. The method of claim 15, wherein the sensing and storing steps for the proximity or contact state of the individual input electrodes are performed sequentially in any order.

17. The method of claim 16, wherein the sensing and storing steps for the proximity or contact state of the one or more groups of input electrodes are performed during or after the sensing and storing steps for the proximity or contact state of the individual input electrodes.

18. The method of claim 17 wherein a time period used for the sensing, comparing and modifying steps for all input electrodes is less than human reaction time for approaching or contacting an input electrode.

19. The method of claim 17, wherein a time period for the sensing, comparing and modifying steps for an individual input electrode is less than or equal to about 64 microseconds.

20. The method of claim 15, wherein the step of modifying the state of the device comprises lighting some of the input electrodes.

21. An electronic apparatus, comprising:

a plurality of individual input electrodes; and a touch and proximity detection system coupled to the plurality of individual input electrodes, wherein in a first mode of operation, the detection system provides an indication of whether or not an input element has touched or is in proximity to a single one of the individual input electrodes, and in a second mode of operation provides an indication of whether or not the input element is in proximity to a parallel-coupled group of multiple ones of the individual input electrodes.

* * * * *